(12) United States Patent
Matsui et al.

(10) Patent No.: US 6,857,767 B2
(45) Date of Patent: Feb. 22, 2005

(54) LIGHTING APPARATUS WITH ENHANCED CAPABILITY OF HEAT DISSIPATION

(75) Inventors: Nobuyuki Matsui, Takatsuki (JP); Hideo Nagai, Takatsuki (JP); Tetsushi Tamura, Takatsuki (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 32 days.

(21) Appl. No.: 10/245,020

(22) Filed: Sep. 17, 2002

(65) Prior Publication Data

US 2003/0072153 A1 Apr. 17, 2003

(30) Foreign Application Priority Data

Sep. 18, 2001 (JP) ........................................ 2001-284108

(51) Int. Cl.[7] .............................................. F21V 29/00
(52) U.S. Cl. ...................... 362/373; 362/231; 362/252; 362/800
(58) Field of Search ............................. 362/23, 29, 30, 362/85, 231, 249, 250, 252, 294, 373, 800; 257/98–100; 313/500

(56) References Cited

U.S. PATENT DOCUMENTS

| | | | | |
|---|---|---|---|---|
| 5,008,788 A | * | 4/1991 | Palinkas | ..................... 362/231 |
| 5,119,174 A | * | 6/1992 | Chen | ........................... 257/98 |
| 5,528,474 A | * | 6/1996 | Roney et al. | ............... 362/294 |
| 5,660,461 A | * | 8/1997 | Ignatius et al. | ............... 257/98 |
| 6,045,240 A | * | 4/2000 | Hochstein | ..................... 362/294 |
| 6,158,867 A | * | 12/2000 | Parker et al. | .................. 362/29 |
| 6,210,010 B1 | * | 4/2001 | Pontetti et al. | .............. 362/231 |
| 6,331,063 B1 | | 12/2001 | Kamada et al. | ............. 362/237 |
| 6,392,891 B1 | * | 5/2002 | Tzlil et al. | .................... 361/719 |
| 6,394,626 B1 | * | 5/2002 | McColloch | .................. 362/251 |
| 6,428,189 B1 | * | 8/2002 | Hochstein | ..................... 362/373 |
| 6,517,213 B1 | * | 2/2003 | Fujita et al. | ................. 362/231 |
| 6,600,427 B2 | * | 7/2003 | Simon et al. | .................. 362/23 |
| 6,612,717 B2 | * | 9/2003 | Yen | ............................. 362/800 |
| 2003/0048641 A1 | * | 3/2003 | Alexanderson et al. | ..... 362/294 |

FOREIGN PATENT DOCUMENTS

JP    11-163412    6/1999

* cited by examiner

Primary Examiner—Alan Cariaso (57) ABSTRACT

A plurality of groups of Light Emitting Diodes (LEDs), each group being made up of three LEDs with red, green, and blue luminous colors respectively, are mounted at positioning areas of a flexible substrate, on the wiring patterns formed on the top surface of the substrate. A plurality of heat dissipation boards are adhered to the bottom surface of the substrate using an adhesive so as to cover the areas corresponding to the positioning areas of the groups of LEDs.

22 Claims, 13 Drawing Sheets

LIGHTING APPARATUS WITH ENHANCED CAPABILITY OF HEAT DISSIPATION

This application is based on an application No. 2001-284108 filed in Japan, the content of which is hereby incorporated by reference.

BACKGROUND OF THE INVENTION (1) Field of the Invention

The present invention relates to lighting apparatuses with light emitting elements mounted thereon, particularly lighting apparatuses that are free to bend.

(2) Description of the Related Art

Light Emitting Diodes (hereafter referred to as LEDs) have been attracting attention as a next-generation light source for their long life spans and future possibilities of having high luminous efficacy. Also, there are ideas to use LEDs in thin-type lighting apparatuses since LEDs are more compact than light sources of the prior art. For example, there is an idea of making a columnar pillar into a lighting fixture by adhering a lighting apparatus with LEDs to the surface of the pillar, in which case, the lighting apparatus needs to bend along the surface of the pillar.

One of the problems is that when a flexible substrate is bent, the areas of the substrate where LEDs are soldered onto also bends, and then, as a result, the solder that electrically and mechanically connects LEDs with the substrate may come off. Consequently, the LEDs may be electrically disconnected from the wiring patterns, or the LEDs themselves may come apart from the substrate.

In the Japanese Laid-Open Patent Application No. 11-163412, it is suggested that a flexible substrate is reinforced by making the substrate thicker at the positioning areas of the LEDs so that those areas do not bend even when the substrate as a whole is bent. In this lighting apparatus, some areas of the substrate, on which wiring patterns are formed in advance, are made thicker and LEDs are mounted on the top surface of those thicker areas.

Generally speaking, for a lighting apparatus, LEDs are usually mounted on a substrate with high density in order to have enough quantity of light because the quantity of light from an individual LED is small. Since the lighting apparatus of the prior art does not have a system to dissipate the heat from the LEDs, a large amount of heat liberated from the LEDs that are mounted with high density would reduce the luminous efficacy and shorten the life span of the LEDs, and this means that the merits of LEDs would be lost.

Also, in the lighting apparatus of the prior art, the thicker areas of the substrate has wiring patterns and there is a problem that it is made difficult to electrically connect the wiring patterns with LEDs as they are apart from each other.

SUMMARY OF THE INVENTION

It is an object of the present invention to provide a lighting apparatus in which it is possible to (1) reinforce the positioning areas of the light emitting elements mounted on the surface of a flexible substrate, (2) easily connect the light emitting elements electrically, and (3) dissipate the heat from the light emitting elements.

The stated object can be achieved by a lighting apparatus comprising: a substrate that is flexible; light emitting elements mounted on a first main surface of the substrate; heat dissipating members attached so as to be in intimate contact with a second main surface of the substrate, wherein each of the heat dissipating members is at least as large as each of positioning areas of the light emitting elements on the substrate, and each of the heat dissipating members is positioned so as to cover and reinforce one or more of areas of the second main surface that correspond to the positioning areas.

With this arrangement, the heat from the light emitting elements is dissipated by the heat dissipating members. Especially, since the heat dissipation boards are attached at the back of the positioning areas of the LEDs, the heat from the light emitting elements can be conducted to the heat dissipation board very efficiently.

Furthermore, since the substrate is reinforced by the heat dissipation boards, even when the substrate is bent, the areas of the substrate in which the heat dissipation boards are attached do not bend easily; therefore, the light emitting elements are prevented from coming apart from the substrate.

Further, the stated object can be achieved by a lighting apparatus comprising: a substrate that is flexible; light emitting elements mounted on a first main surface of the substrate; one or more heat dissipating members attached so as to be in intimate contact with a second main surface of the substrate, wherein each of the heat dissipating members is at least as large as each of positioning areas of the light emitting elements on the substrate, and the heat dissipating members have at least one removal area being less stiff than other areas in an area that corresponds to a non-positioning area of the substrate in which no light emitting elements are mounted.

With this arrangement, the heat from the light emitting elements is dissipated by the heat dissipating member. Especially, since the heat dissipation board is attached at the back of the positioning areas of the LEDs, the heat from the light emitting elements can be conducted to the heat dissipation board very efficiently.

Furthermore, since the heat dissipation board has removal areas at the back of non-positioning areas of the light emitting elements, even when the substrate is bent, the areas of the substrate in which the heat dissipation board is attached do not bend easily; therefore, the light emitting elements are prevented from coming apart from the substrate.

BRIEF DESCRIPTION OF THE DRAWINGS

These and the other objects, advantages and features of the invention will become apparent from the following description thereof taken in conjunction with the accompanying drawings which illustrate a specific embodiment of the invention.

In the drawings.

DESCRIPTION OF THE PREFERRED EMBODIMENT

The following describes a lighting apparatus according to preferred embodiments of the present invention with reference to the drawings.

First Embodiment

1. Structure of the Lighting Apparatus

Figure 1:
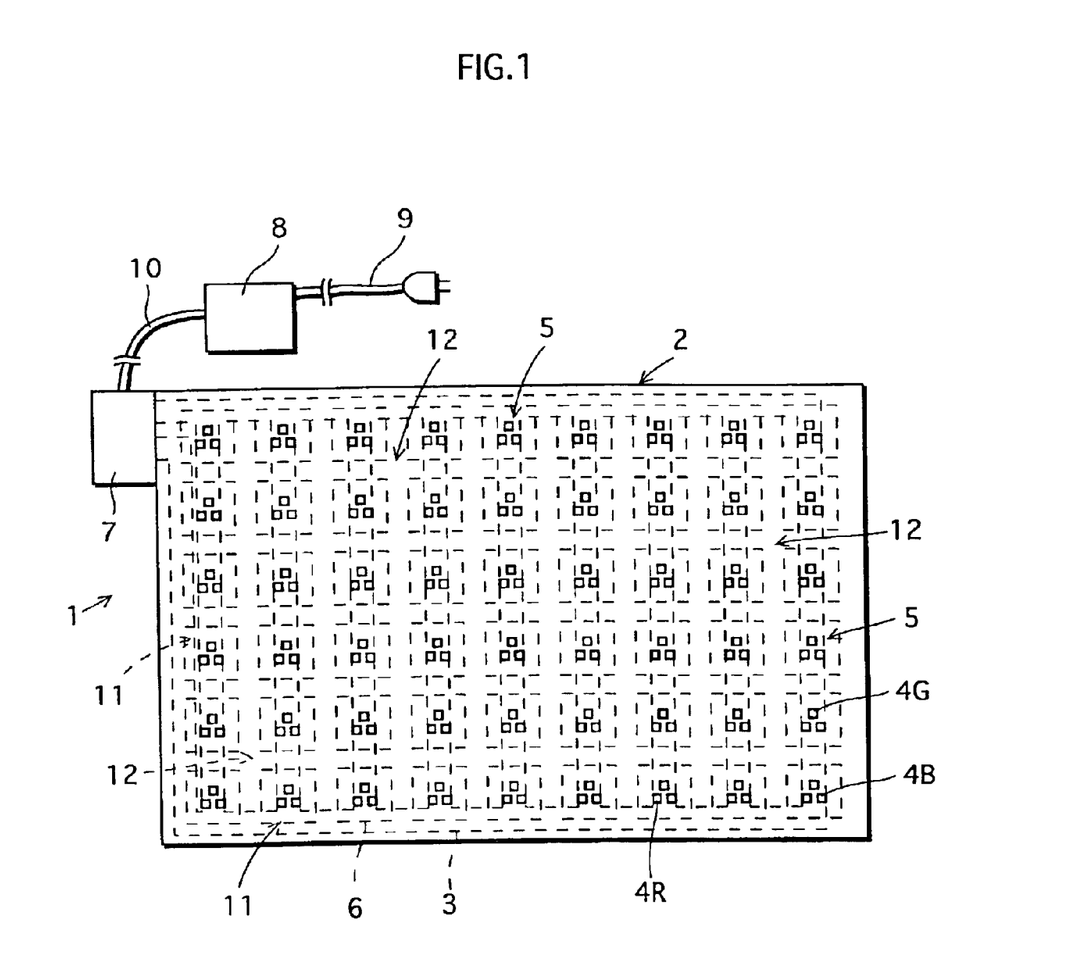
FIG. 1 is a plan view of the substrate in the lighting apparatus in the first embodiment of the present invention.
Figure 2:
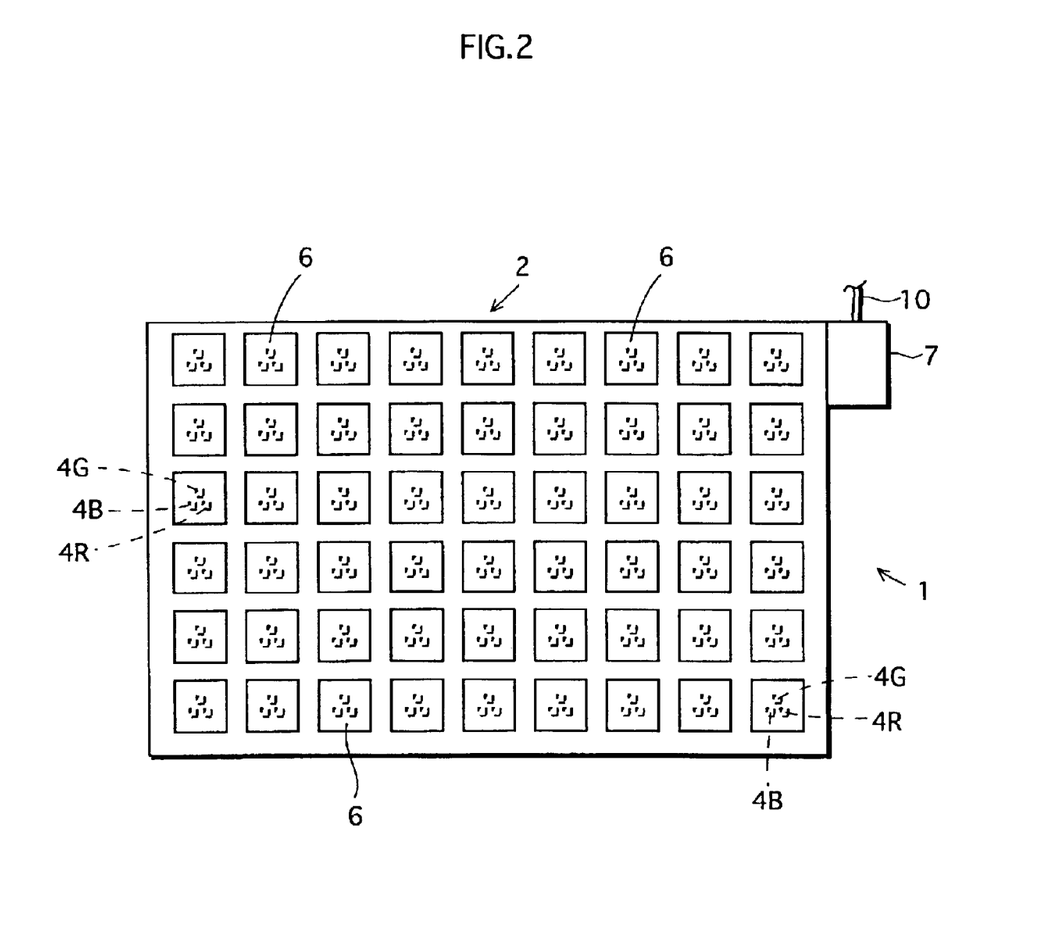
FIG. 2 is a plan view from the bottom surface of the substrate in the lighting apparatus in the first embodiment of the present invention.

FIG. 1 is a plan view of the whole substrate in the lighting apparatus of the present invention. FIG. 2 is a plan view from the bottom surface of the substrate in the lighting apparatus. As shown in FIG. 1 and FIG. 2, the lighting apparatus 1 comprises a substrate 2 that is flexible, wiring patterns 3 formed on the top surface of the substrate 2, a plurality of LED groups 5 mounted on the wiring patterns 3 on the substrate 2, each of the LED groups 5 being made up of three LEDs 4R, 4G or 4B, a plurality of heat dissipation boards 6 (see FIG. 2) attached on the bottom surface of the substrate 2 at the areas corresponding to the positioning areas of the LED groups 5 on the top surface, a power supply terminal 7 connected to the wiring patterns 3, a controller 8 that is connected with the power supply terminal 7 and that controls the power supplied to the LEDs 4R, 4G, and 4B, and a power cable 9 that is connected to a power supply which is not shown in the drawing and that supplies electricity to the controller 8. The luminous colors of the LEDs are red (R), green (G), and blue (B), and the components of the lighting apparatus relating to luminous colors are expressed with a combination of a number and one of the letters of R, G or B.

The substrate 2 is rectangular and flat, and is made of 0.2 mm-thick glass epoxy (glass fiber reinforced plastic), for example. On the top surface of the substrate 2, the LED groups 5 are orderly mounted at regular intervals in longitudinal and latitudinal directions. On the bottom surface of the substrate 2, heat dissipation boards 6 are adhered to the substrate 2 using an adhesive in a manner that the heat dissipation boards cover the areas corresponding to the positioning areas of the LED group 5. The heat dissipation boards 6 are attached for the purpose of dissipating the heat caused by the LEDs 4R, 4G, and 4B when they emit light.

It is also acceptable to attach the heat dissipation boards 6 to the substrate 2 using, instead of an adhesive, an adhesive sheet with heat conductivity, for example a sheet onto which an adhesive made of acrylic resin is applied. The material of the substrate 2 also could be synthetic resin film such as polyimide film instead of glass epoxy. The thickness does not have to be exactly 0.2 mm, but the substrate 2 needs to be at least manually bendable.

The areas of the substrate 2 at which the LED groups 5 are mounted are simply referred to as "positioning areas" and indicated by number 11, and the areas of the substrate 2 at which the LED groups 5 are not mounted are simply referred to as "non-positioning areas" and indicated by number 12.

The wiring patterns 3 are formed in a shape of a ladder sideways as shown in FIG. 1; the wiring patterns at the areas corresponding to the ladder steps connect, in series, each of the LED groups 5 in the longitudinal columns, and the wiring patterns at the areas corresponding to the ladder frames connect those columns in parallel.

The connecting cable 10 is connected to the controller 8 on the first end. The second end of the connecting cable 10 is electrically connected, via the power supply terminal 7, to the start and the end of the wiring patterns 3 formed on the substrate 2. The connecting cable 10 is connected to the wiring patterns 3 inside the power supply terminal 7 by a crimp contact, for instance, attached on the second end of the connecting cable 10.

The controller 8 has a rectifying circuit that rectifies the alternating current electricity supplied by a commercial power source via the power cable 9 into direct current electricity as well as a voltage regulating circuit that regulates the voltage of the rectified direct current electricity into an appropriate voltage for the LEDs, 4R, 4G and 4B. The lighting apparatus 1 will be attached to a pillar and the like by the substrate 2, while the LEDs 4R, 4G and 4B on the substrate 2 are supplied with electricity via the power cable 9, the controller 8, the connecting cable 10, and the power supply terminal 7.

Figure 3:
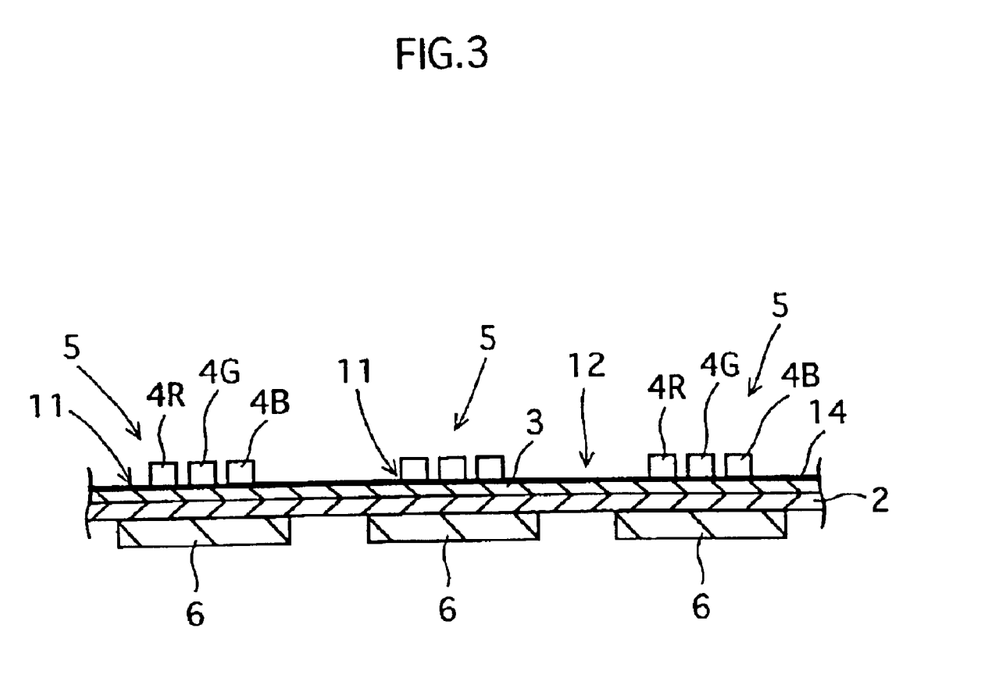
FIG. 3 is an enlarged longitudinal sectional view of the substrate in the first embodiment of the present invention.

FIG. 3 is an enlarged longitudinal sectional view of the substrate. As shown in FIG. 3, on the top surface of the substrate 2 is the wiring patterns 3 of thin-film copper formed by a method publicly known such as etching processing. Almost the entire top surface of the substrate 2, except for the positioning areas of the LEDs 4R, 4G and 4B, has a protective layer 14 formed thereon for the purpose of protecting the wiring patterns 3. The material used for the protective layer 14 is a resist such as novolac resin, polyvinyl-phenol and so on.

Figure 4:
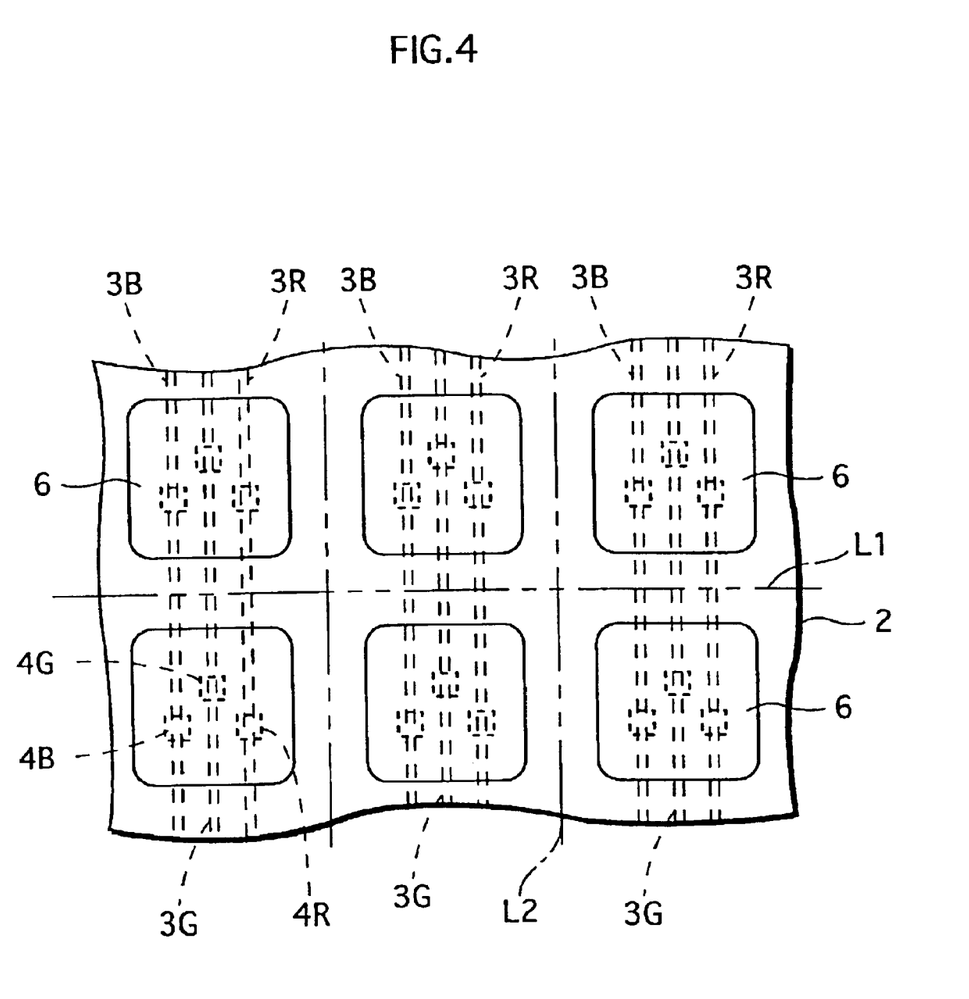
FIG. 4 is an enlarged plan view of the substrate in the first embodiment of the present invention.

FIG. 4 is an enlarged plan view of the substrate as seen from the bottom.

The LEDs 4R, 4G and 4B are positioned in the same manner in all of the LED groups 5, for example, in the order of red, green and blue from the left in FIG. 3. The LEDs 4R, 4G and 4B are positioned at vertexes of a triangle and are connected to the wiring patterns 3R, 3G, and 3B corresponding to the different luminous colors.

The shape of each of the heat dissipation boards 6 is substantially square. The four corners of each square of the heat dissipation boards are rounded in the arc shapes in order to prevent stress concentration at those corners as well as to prevent the substrate 2 from being damaged by those corners when the substrate 2 is bent. The heat dissipation boards 6 are made of a material with high heat conductivity, more specifically, a metal.

In the first embodiment of the present invention, the heat dissipation boards 6 are, for example, 0.1 mm-thick aluminum boards. And, each of the heat dissipation boards 6 is larger than each of the positioning areas 11 of the LED groups 5, so that the substrate 2 does not bend at least at the positioning areas 11, even when the substrate 2 as a whole is bent.

Figure 5:
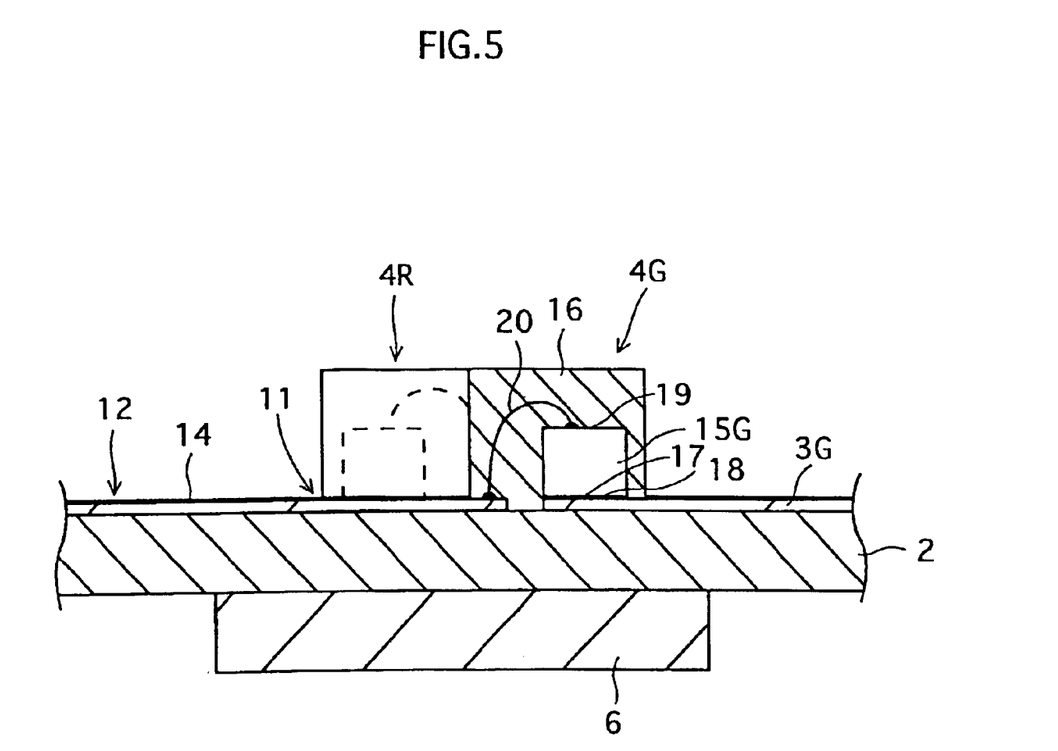
FIG. 5 is an enlarged longitudinal sectional view of the substrate around a positioning area in the first embodiment of the present invention.

FIG. 5 is an enlarged longitudinal sectional view of the substrate around a positioning area, in this case, a positioning area of the LED 4G. The LED 4G is made up of a bare chip LED 15G that emits green light, and a sealing member 16 that seals up the bare chip LED 15 therein.

The cathode terminal 17 at the bottom of the bare chip LED 15G is connected electrically and mechanically by silver paste 18 to the cathode side of the wiring pattern 3G, which is Au-plated (not shown in the drawing). The anode terminal 19 on top of the bare chip LED 15G is connected to the anode side of the wiring pattern 3G by gold wire 20.

Additionally, the bare chip LED 15G is sealed up in the sealing member 16. The LEDs 4R and 4B are arranged in the same way as the LED 4G. The bare chip LEDs 15R and 15B are respectively connected to the wiring patterns 3R and 3B, and are both sealed up in their respective sealing member 16.

The sealing member 16 is made of synthetic resin such as epoxy resin, acrylic resin, and polycarbonate resin. It is desirable to choose a resin with high heat resistance in view of the heat caused by the LEDs 4R, 4G, and 4B when they emit light. Needless to say, it is desirable to choose an adhesive with high heat resistance for adhering the heat dissipation boards 6 to the bottom surface of the substrate 2.

In the lighting apparatus 1 with the above-mentioned arrangement, the heat dissipation boards 6 are attached on the bottom surface of the substrate 2 at the areas corresponding to the positioning areas of LED groups 5 on the top surface; therefore, the heat from the LEDs 4R, 4G, and 4B is conducted from the substrate 2 to the heat dissipation boards 6, and thus dissipated by the heat dissipation boards 6. In this manner, even if a large number of LEDs, 4R, 4G, and 4B mounted on the substrate 2 liberate heat when they emit light, it is possible to avoid lowering luminous efficacy and shortening life span of the LEDs.

Moreover, since each of the heat dissipation boards 6 is larger than each of the positioning areas of the LED groups 5 made up of LEDs 4R, 4G, and 4B, the heat dissipation boards dissipate heat by a large amount, as well as ensure that the positioning areas 11 are reinforced.

Furthermore, since the LEDs 4R, 4G and 4B are respectively mounted on the wiring patterns 3R, 3G, and 3B on the substrate 2, it is easier to electrically connect the LEDs to the wiring patterns than in the case of the prior art in which the wiring patterns are formed on a substrate that is reinforced by making thicker areas.

2. The Lighting Apparatus as Being Attached

Figure 6:
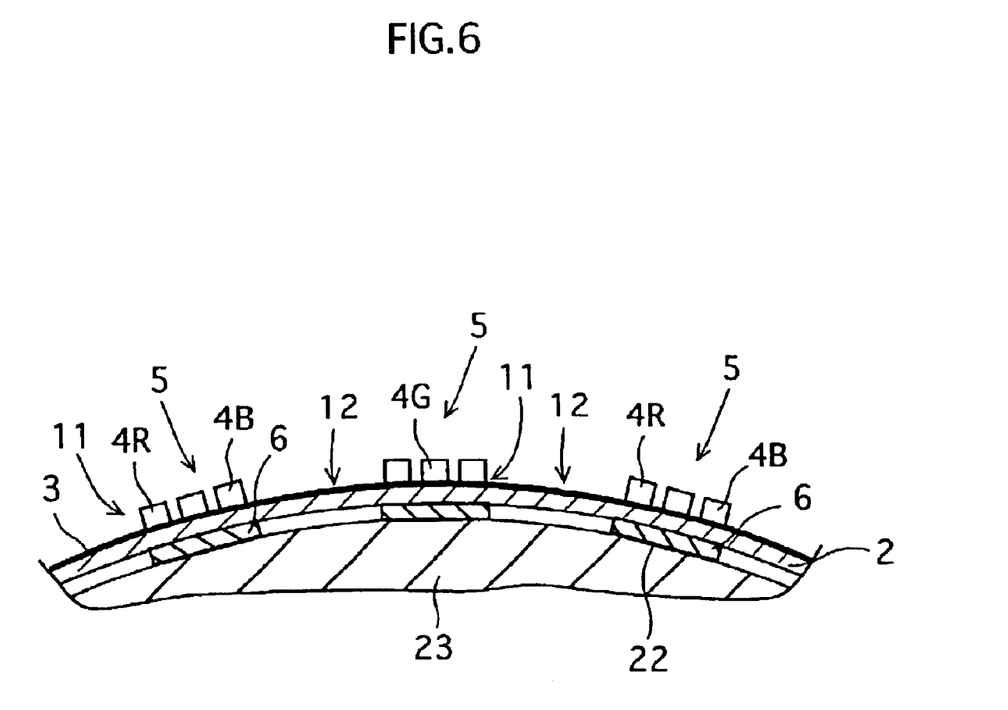
FIG. 6 is a latitudinal sectional view of the lighting apparatus in the first embodiment of the present invention as being attached on a pillar.

FIG. 6 is a latitudinal sectional view of an example of the lighting apparatus as being attached on a columnar pillar. As shown in the drawing, the lighting apparatus 1 is attached to the pillar 23 by adhering the heat dissipation boards 6 to the pillar 23 with the adhesive 22 applied on the pillar-side surface of the heat dissipation boards 6.

As seen in the drawing, since the substrate 2 is flexible, it is possible to attach the substrate 2 to the pillar 23 along the curving surface of the pillar. As the heat dissipation boards 6 are attached on the bottom surface of the substrate 2 at the areas corresponding to the positioning areas 11, the substrate 2 is more stiff at the positioning areas 11 than at the areas in which the heat dissipation boards 6 are not attached.

Consequently, the substrate 2 hardly bends at the areas in which the heat dissipation boards 6 are attached. Instead, the substrate 2 bends in a manner that the substrate 2 forms a linear convexity (the suppositional line of L1 in FIG. 4) in the area between the rows of the heat dissipation boards 6.

This way, even the substrate 2 is attached to the pillar 23 as being bent, there is hardly any load weighted on the silver paste 18 and the gold wire 20 connecting the LEDs 4R, 4G, and 4B to the substrate 2. It is also possible that the substrate 2 bends in a manner that the substrate 2 forms a linear convexity (the suppositional line of L2 in FIG. 4) in the area between the rows of the heat dissipation boards 6. Further, it is possible that the substrate 2 bends in a manner that the substrate 2 forms linear concavities (the suppositional lines of L1 and L2 in FIG. 4) in the areas between the rows of the heat dissipation boards 6.

The first embodiment of the present invention illustrates a case in which the lighting apparatus is attached to a columnar pillar. Further, it is also possible that the lighting apparatus is attached on a pillar in other than a columnar shape, such as a prismatic shape. Additionally, it is also possible to attach a lighting apparatus on an undulating surface of a wall or a ceiling by bending and fitting the substrate 2 along the surface.

Second Embodiment

Figure 7:
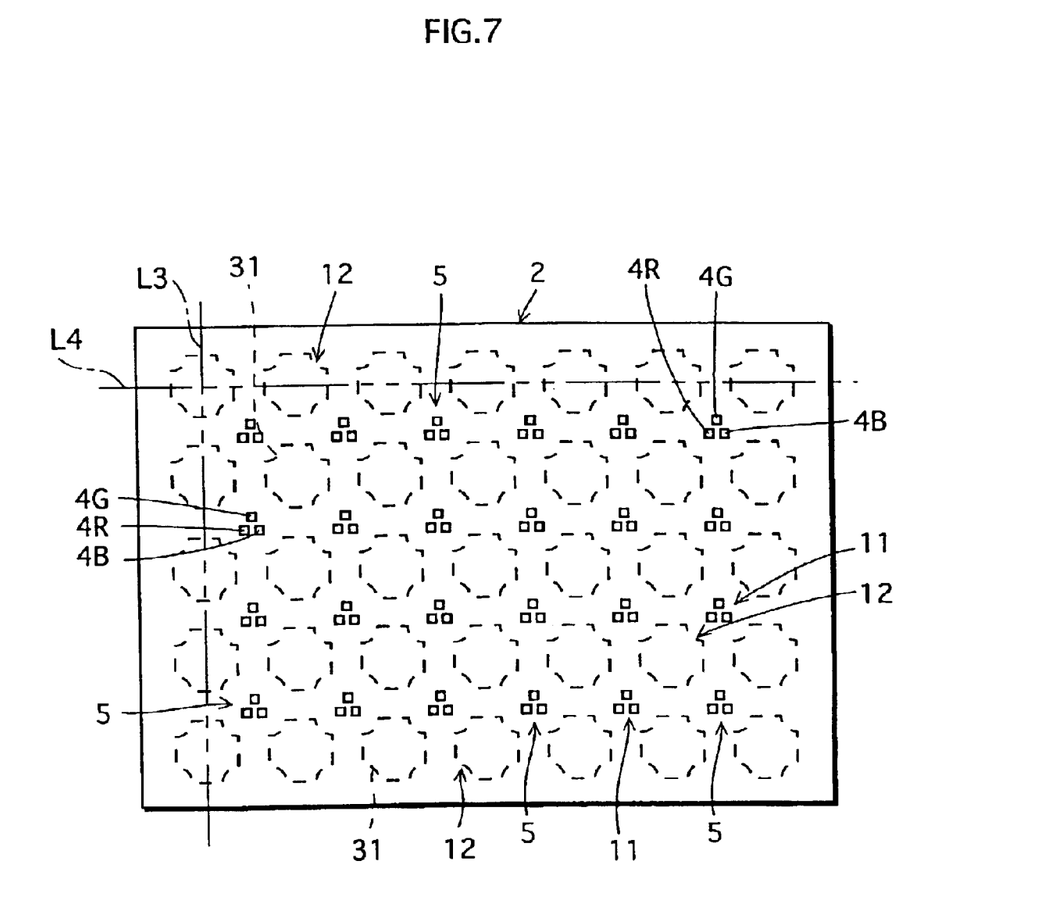
FIG. 7 is a plan view of the substrate in the second embodiment of the present invention.
Figure 8:
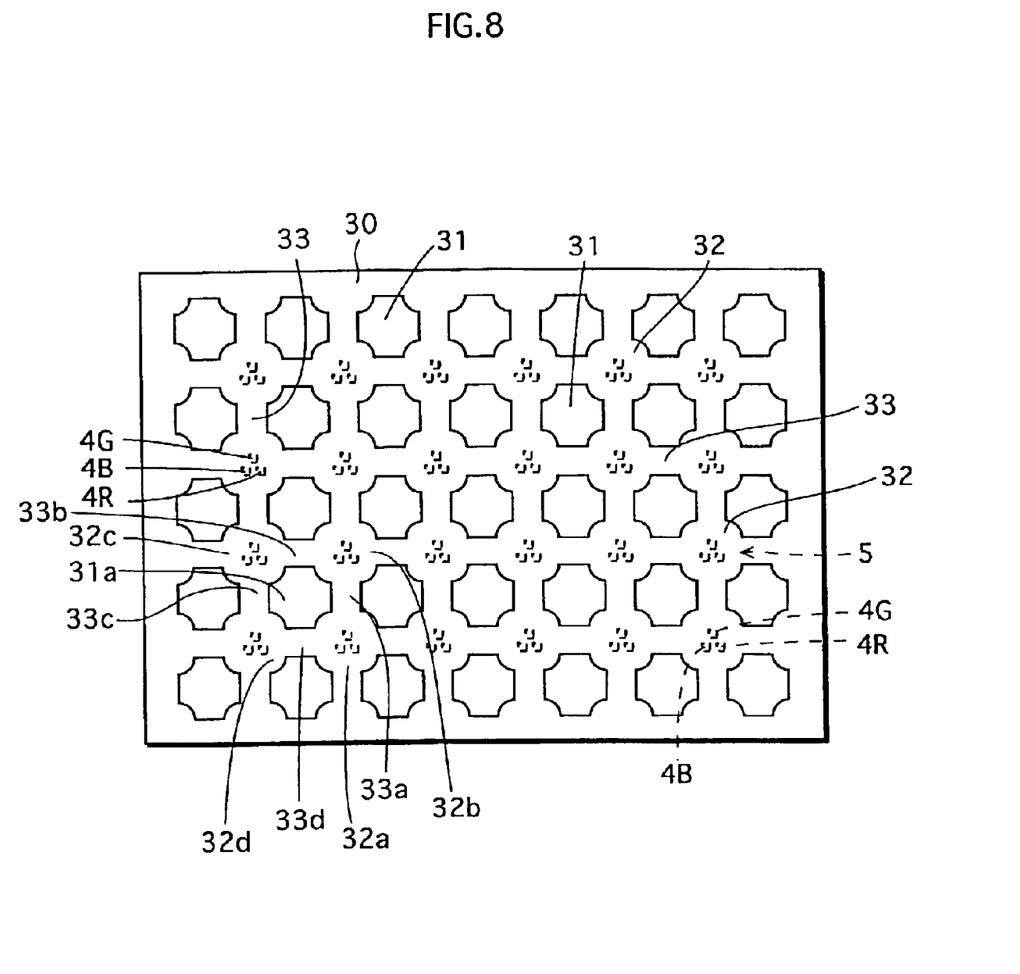
FIG. 8 is a plan view from the bottom surface of the substrate in the second embodiment of the present invention.

FIG. 7 is a plan view of an example of the lighting apparatus in the second embodiment of the present invention. FIG. 8 is a plan view from the bottom surface of the substrate in the second embodiment.

In the first embodiment, the heat dissipation boards 6 are attached to the bottom surface of the substrate 2 at the areas corresponding to the positioning areas of each of the LED groups 5. In other words, the positioning area of one LED group 5 is reinforced by one heat dissipation board 6.

On the other hand, in the second embodiment as shown in FIGS. 7 and 8, only one heat dissipation board 30 is attached on the bottom surface of the substrate 2 for a plurality of LED groups 5 together or, for example, for all of the LED groups 5. And then, the heat dissipation board 30 has a plurality of openings 31 at the areas that correspond to the non-positioning areas 12, so that the substrate 2 bends at the areas between LED groups 5. Since some of the components mentioned in the second embodiment, such as the substrate 2 and the LED groups 5, are the same as the ones mentioned in the first embodiment, they are indicated by the same numbers as in the first embodiment and explained in the following paragraphs.

Each of the LED groups 5 is made up of three LEDs with different luminous colors, 4R, 4G, and 4B, in the same manner as in the first embodiment. The LED groups 5 are orderly mounted on the top surface of the substrate 2 in longitudinal and latitudinal directions at regular intervals. The heat dissipation board 30 has a shape and a size that are substantially the same as the substrate 2. The heat dissipation board 30 is attached to the bottom surface of the substrate 2 in a manner that the heat dissipation board 30 entirely covers the bottom surface of the substrate 2.

The heat dissipation board 30 is made of a metal such as approximately 50 $\mu$m-thick stainless. The heat dissipation board 30 is thin enough to be free to bend when attached to the substrate 2. As shown in FIG. 8, heat dissipating areas 32 of the heat dissipation board 30 correspond to the positioning areas 11 of the substrate 2. The heat dissipating areas 32 dissipate the heat from the LEDs 4R, 4G and 4B in the LED groups 5, and at the same time, reinforce the positioning areas 11.

The openings 31 in the heat dissipation board 30 are formed by blanking processing in the areas besides the heat dissipating areas 32. As shown in FIG. 8, one of the openings e.g. 31a in the heat dissipation board 30 is located inside a square whose vertexes are four heat dissipating areas, 32a, 32b, 32c, and 32d which each corresponds to a positioning area 11 on the substrate 2. The linking area 33 remaining between two of the openings 31 connects two heat dissipating areas 32. As shown in FIG. 8, the shape of an opening 31 is a square whose four sides are surrounded by the four linking areas, 33a, 33b, 33c, and 33d, and whose four corners are respectively rounded inwards, for example, by heat dissipating areas 32a, 32b, 32c, and 32d.

Since the heat dissipation board 30 has openings at the areas corresponding to the non-positioning areas 12 of the substrate 2, the substrate 2 is less stiff at the non-positioning areas 12 than at the positioning areas; therefore, it is possible to bend the substrate 2 at the areas between the positioning areas 11, even if the heat dissipation board 30 is attached thereon. In other words, the substrate 2 bends in a manner that the substrate 2 forms linear convexities or linear concavities (the suppositional lines of L3 and L4 shown in the FIG. 7).

Modifications

This invention so far has been explained on the basis of the preferred embodiments; however, needless to say, the contents of this invention are not limited to the concrete examples illustrated in the embodiments mentioned above. The following describes other possible modifications of the present invention.

(1) In the first embodiment, the LED groups 5 are mounted on the substrate 2 in longitudinal and latitudinal directions at regular intervals, but it is also acceptable that the LED groups 5 are mounted in a different manner. The shape of each of the heat dissipation boards 6 is a square, but it is also acceptable that they are in a different shape.

Figure 9:
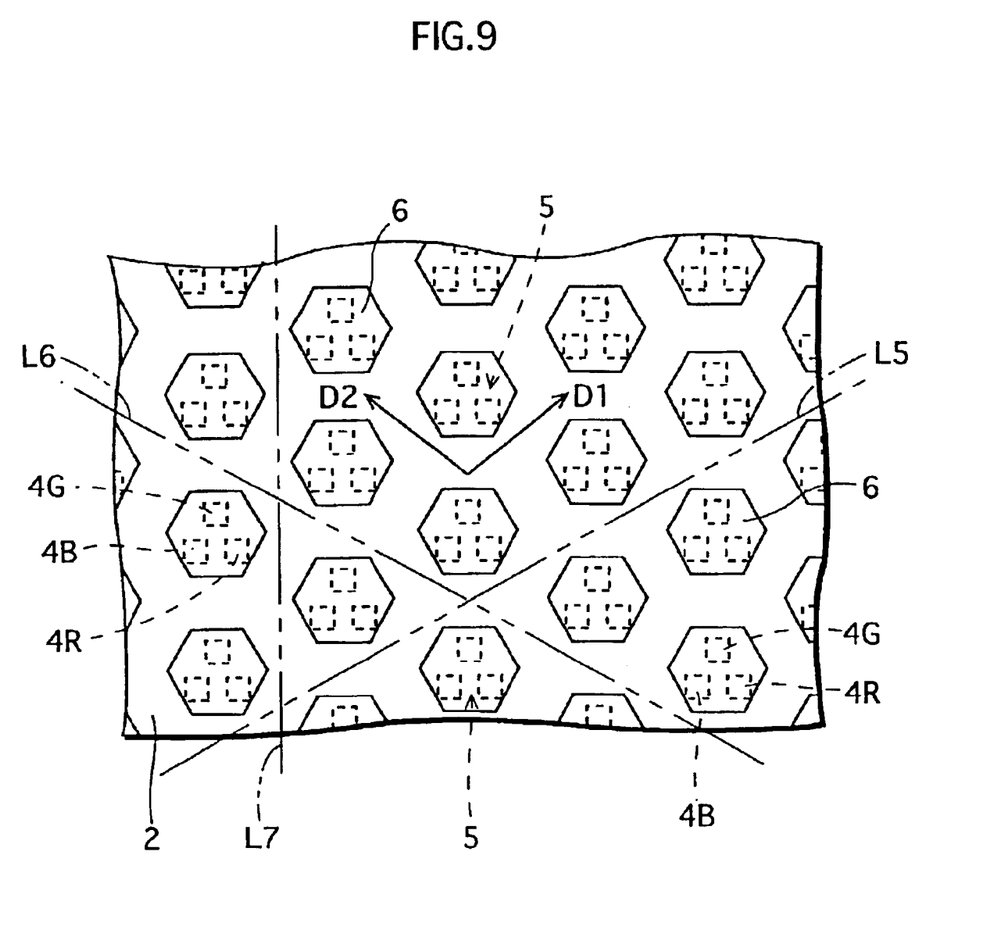
FIG. 9 is a partial plan view from the bottom surface of the substrate in a modification of the first embodiment of the present invention.

For example, it is acceptable that the LED groups 5 are mounted at regular intervals in a manner that the rows of LED groups 5 in two directions (D1 and D2) intersect each other at some degrees other than 90 degrees as shown in FIG. 9. It is also acceptable that the shape of each of the heat dissipation boards 6 is a hexagon.

As shown in FIG. 9, since the heat dissipation boards 6 are attached to the bottom surface of the substrate 2 at the areas corresponding to the positioning areas 11 of the LED groups 5, the heat from the LED groups 5 is conducted from the substrate 2 to the heat dissipation boards 6, and thus dissipated by the heat dissipation boards 6. When the substrate 2 is bent, the substrate 2 bends only at certain areas in which heat dissipation boards 6 are not attached, in other words, at the areas in which the LED groups 5 are not mounted. The substrate 2 hardly bends at the areas where the heat dissipation boards 6 are attached.

Since the LED groups 5 are mounted on the substrate 2 at regular intervals in two directions, it is possible, as shown in FIG. 9, that the substrate 2 bends in a manner that the substrate 2 forms linear convexities or linear concavities (the suppositional lines of L5, L6, and L7) which run on the substrate 2 not only in longitudinal and latitudinal directions as in the first embodiment, but also in a diagonal direction. Furthermore, in the first embodiment and this modification example, the shape of each of the heat dissipation boards 6 is illustrated as a square or a hexagon; however, it is acceptable that each of the heat dissipation boards has a shape of any other polygons, or is in a circular or oval shape.

Figure 10:
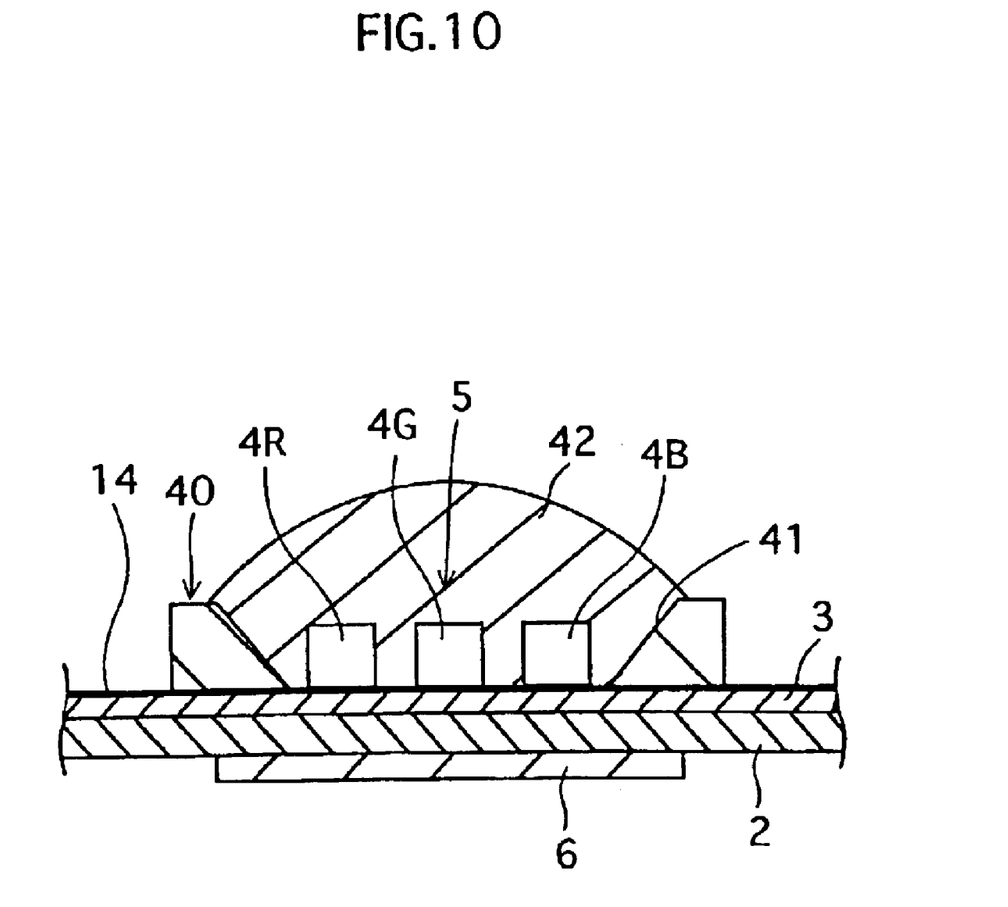
FIG. 10 is an enlarged longitudinal sectional view of the substrate around a positioning area in a modification of the first embodiment of the present invention with a reflecting means and a lens additionally installed.

(2) As the LED groups 5 are mounted on the substrate 2 in the embodiments mentioned earlier, it is acceptable that a reflecting means is installed with the LED groups 5 for the purpose of reflecting the light emitted by the LEDs 4R, 4G, and 4B toward a specific direction. FIG. 10 is an enlarged longitudinal sectional view around a positioning area 11 in the first embodiment of the present invention with a reflecting means 40 and a lens 42 additionally installed.

The reflecting means 40 is in a columnar shape having a hollow, and surrounds the LED group 5. The internal diameter of the reflecting means 40 increases as getting away from the substrate 2 in a vertical direction, such as in the shape of a funnel. The part that corresponds to the internal surface of the funnel is referred to as a light reflecting area 41.

Part of the light emitted by the LEDs 4R, 4G and 4B is reflected toward a specific direction by the light reflecting area 41. By either installing a reflecting mirror or applying white paint to the light reflecting area 41, it is possible to prevent the quantity of light emitted by the LED groups 5 from getting low.

The lens 42 is installed with the reflecting means 40 so as to entirely cover the LED group 5. The lens 42 is made of transparent synthetic resin and is arranged in a manner that the synthetic resin fills in the hollow inside the reflecting means 40 as well as further forms a partial sphere over the reflecting means 40. The lens 42 is formed in a manner that it seals up the LED group 5 inside the reflecting means 40 using synthetic resin.

By having these reflecting means 40 and lens 42, part of the light emitted by the LEDs 4R, 4G, and 4B are combined due to reflection at the light reflecting area 41 of the reflecting means 40 and at the border of the lens 42 and the air.

This is effective for preventing the luminous colors from being uneven to a certain extent. If it is necessary to prevent the luminous colors from being uneven to a further extent, it is possible to mix a light scattering powder such as silica into the lens 42.

Figure 11:
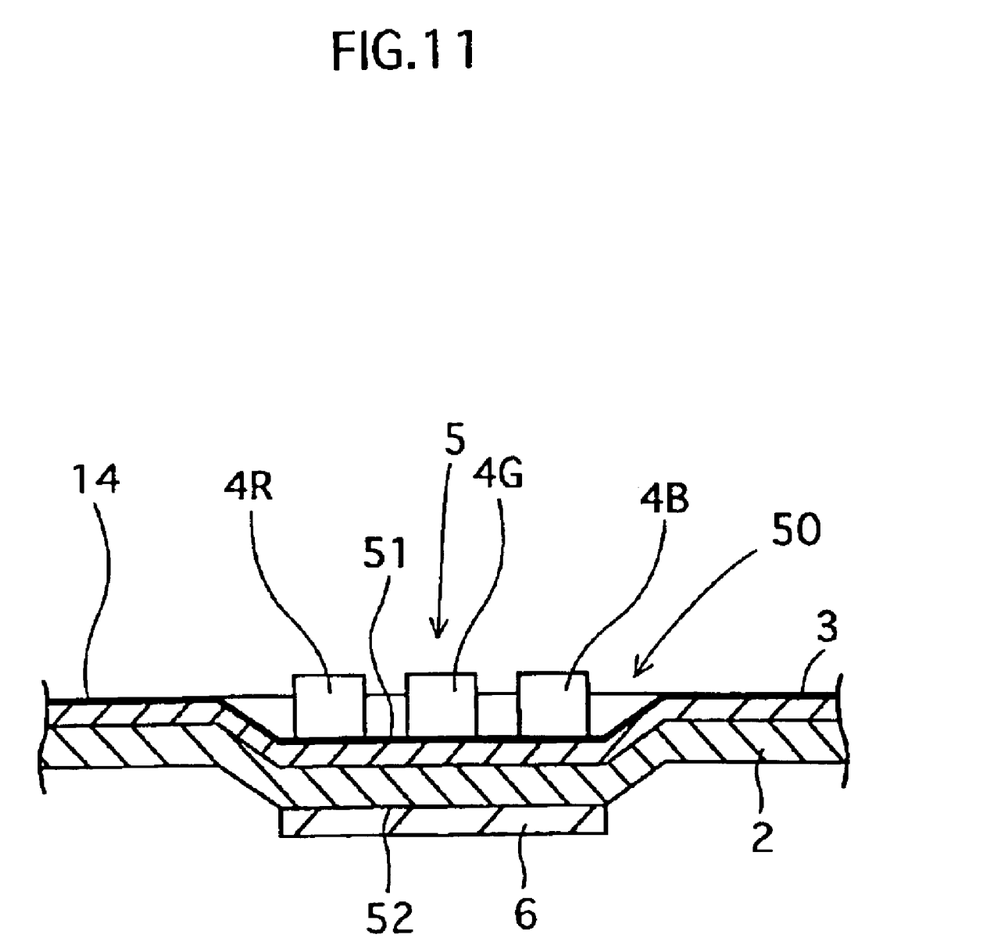
FIG. 11 is a longitudinal sectional view of flexible substrate with a heat dissipation board attached at the lower surface of a concave.

(3) In the embodiments mentioned earlier, the substrate 2 is flat; however, it is possible that the substrate 2 is made of a material that is flexible and deformable by plastic deformation. And then, as shown in FIG. 11, the substrate 2 has a plurality of concaves 50 formed by vertical depressing force. The LED group 5 is mounted on a surface 51 (hereafter referred to as the upper surface) of the bottom of each of the concaves 50; and a heat dissipation board 6 is attached to the other surface 52 (hereafter referred to as the lower surface) of the bottom of each of the concaves 50.

By having such concaves 50 in the substrate, those areas become more stiff. Especially, the heat dissipation boards 6 attached to the lower surface 52 of the bottom of each of concaves 50 further give remarkable reinforcement to the bottom of the concaves. Consequently, even when the substrate 2 is bent, the bottom of the concaves 50 where the LED groups 5 are installed hardly bends. Also, in such a case, the heat from the LEDs 4R, 4G and 4B is conducted from the substrate 2 to the heat dissipation boards 6, and thus dissipated by the heat dissipation boards 6.

Figure 12:
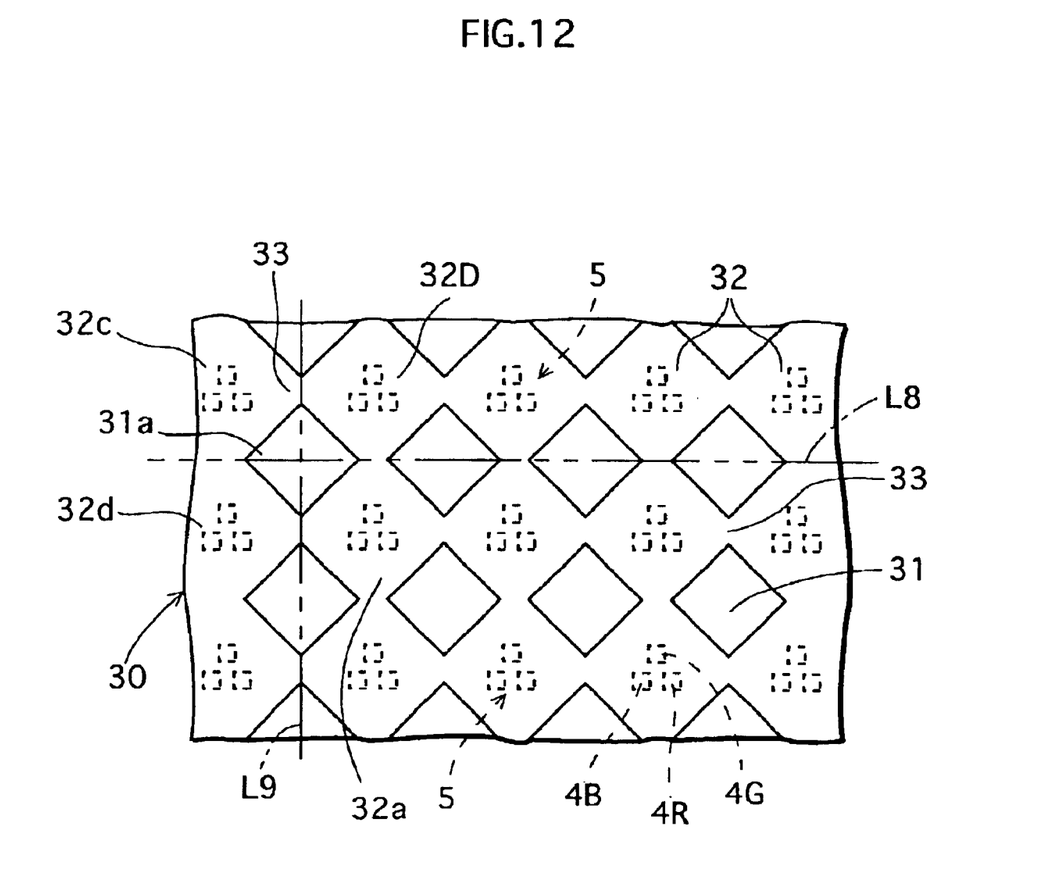
FIG. 12 is a partial plan view from the bottom surface of the substrate with a heat dissipation board having diamond-shaped openings being attached thereon.

(4) In the second embodiment mentioned earlier, the shape of an opening 31 is a square whose four corners are rounded in the arc shapes; however it is possible that an opening has a different shape. For example, as shown in FIG. 12, it is possible that the shape of an opening 31 is a diamond whose diagonals run in longitudinal and latitudinal directions.

In the same manner as the second embodiment, one of the openings, 31a, is located inside a square whose vertexes are four heat dissipating areas, 32a, 32b, 32c, and 32d. Since the diamond-shaped openings have their diagonals in longitudinal and latitudinal directions, it is easy to bend the substrate 2 in a manner that the substrate 2 forms linear convexities or linear concavities (the suppositional lines of L8 and L9).

Figure 13:
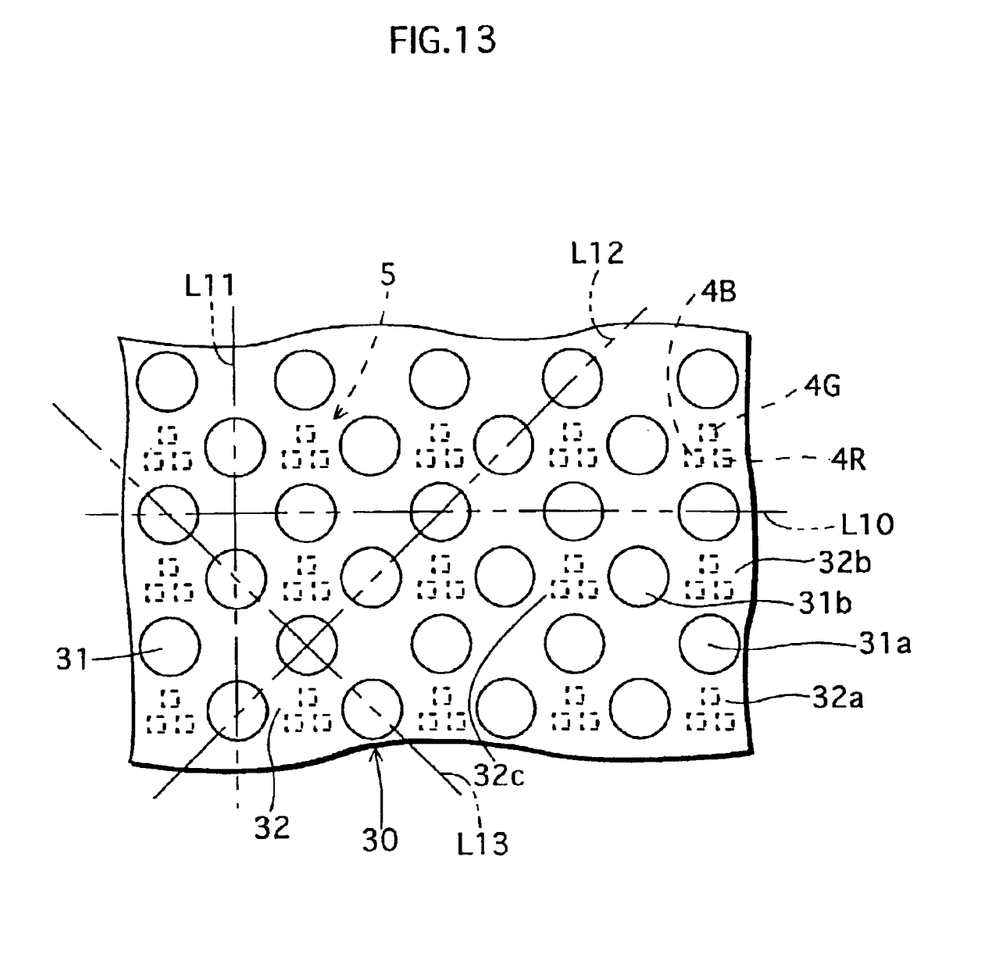
FIG. 13 is a partial plan view from the bottom surface of the substrate with a heat dissipation board attached thereon having circular openings between LED groups.

(5) In the second embodiment, an opening 31 is located inside a square whose vertexes are four heat dissipating areas 32; however, it is acceptable that an opening 31 in a circular shape is located between the two heat dissipating areas neighboring in longitudinal and latitudinal directions as shown in FIG. 13. More specifically, the opening 31a is located between the two heat dissipating areas 32a and 32b neighboring in a longitudinal direction; and the opening 31b is located between the two heat dissipating areas 32b and 32c neighboring in a latitudinal direction.

By having the openings 31 located in the above-mentioned manner, it is possible to bend the substrate 2 along diagonal lines such as L12 and L13 as well as along longitudinal and latitudinal lines such as L10 and L11. Needless to say, it is possible that the shape of each opening 31 is other than circular.

(6) In the first embodiment, a heat dissipating member is provided for each group of LEDs. The heat dissipating members for the groups are not in continuity. In the second embodiment, only one heat dissipating member is provided for all the groups of LEDs. The second embodiment is superior in terms of heat dissipation of each group of LEDs in view of conductivity of heat dissipation paths, but the first embodiment is superior in terms of maintaining the flexibility of the substrate. In view of this, in the present invention, it is apparent that there could be an intermediate embodiment between the first embodiment and the second embodiment, which have opposite properties in terms of flexibility and heat dissipation efficiency. An example of an intermediate embodiment would be to have an arrangement wherein the openings in the second embodiment are in continuity, for instance, in the row direction or the column direction (i.e. in the longitudinal direction or the latitudinal direction), that is to say, a heat dissipating member is provided for each unit made up of groups of LEDs. In other words, this is an arrangement wherein "one or more heat dissipating members" are attached on a second main surface (being an opposite surface of the first main surface on which light emitting elements are disposed) of the substrate that is flexible.

(7) In the embodiments mentioned earlier, the LEDs 4R, 4G, and 4B are bare chip LEDs 15 that are sealed up in the sealing member 16 and are mounted by wire bonding; however, it is possible that bare chip LEDs are mounted by flip-chip bonding, or that LEDs are SMD (surface mounted device)-type LEDs. In case that bare chip LEDs are mounted by flip-chip bonding, it is desirable if the bottom of the bare chip LEDs are connected to the wiring patterns with ball-shaped metal bumps. In case that SMD-type LEDs are used, it is desirable if the electrodes on their sides are connected to the wiring patterns by soldering or the like.

(8) In the second embodiment mentioned earlier, the openings 31 in the heat dissipation board 30 are formed by blanking processing; however, it is acceptable to use other processing methods such as drilling process using a drilling machine, laser processing or etching process.

Especially, in case that the openings 31 are formed by etching process, it is possible to make openings after the heat dissipation board 30 is adhered to the bottom surface of the substrate 2. In the second embodiment, some areas of the heat dissipation board 30 corresponding to the non-positioning areas 12 are completely removed to make the openings 31 in a form of holes; however, it is possible to remove the corresponding areas of the heat dissipation board 30 so as to reduce its thickness in a form of depressions, in case etching process is used.

With etching process, it is possible to adhere a heat dissipation board to the bottom surface of the substrate 2, and then remove completely all of the areas of the heat dissipation board corresponding to the non-positioning areas 12. This way, it is possible to have the same arrangement as in the first embodiment, in which one heat dissipation board 6 covers the area corresponding to the positioning area of one LED group 5.

Although the present invention has been fully described by way of examples with reference to the accompanying drawings, it is to be noted that various changes and modifications will be apparent to those skilled in the art. Therefore, unless such changes and modifications depart from the scope of the present invention, they should be construed as being included therein.

What is claimed is:

1. A light apparatus comprising:
   a substrate that is flexible;
   heat dissipating members being equal in size that are attached so as to be in intimate contact with a first main surface of the substrate at intervals;
   a plurality of light emitting elements mounted on a second main surface of the substrate so as to be positioned in correspondence with areas in which the heat dissipating members are attached.

2. The light apparatus of claim 1, wherein the light emitting elements are positioned so as to form groups each being made up of a predetermined number of light emitting elements, the predetermined number being one or larger.

3. The lighting apparatus of claim 1, wherein the plurality of light emitting elements form groups and each of the groups includes at least two light emitting elements that have mutually different luminous colors.

4. The lighting apparatus of claim 1, wherein the plurality of light emitting elements form groups and the groups of light emitting elements are positioned at intervals in two directions on the substrate.

5. The lighting apparatus of claim 1, wherein the plurality of light emitting elements form groups and the groups of light emitting elements are positioned substantially in a matrix formation.

6. The lighting apparatus of claim 1, wherein the light emitting elements are LEDs.

7. The lighting apparatus of claim 1, wherein the plurality of light emitting elements form groups and each of the groups is made up of three LEDs with luminous colors of red, green, and blue respectively.

8. The lighting apparatus of claim 1, wherein the plurality of light emitting elements form groups, each of the groups is made up of three LEDs, and the three LEDs in each of the groups are positioned at each of vertexes of a substantially regular triangle.

9. A lighting apparatus comprising:
   a substrate that is flexible;
   light emitting elements mounted, in groups of one or more light emitting elements, within positioning areas on a first main surface of the substrate;
   a heat dissipating member attached so as to be in intimate contact with a second main surface of the substrate, wherein
   the heat dissipating member is at least as large as each of the positioning areas of the light emitting elements on the substrate, and
   the heat dissipating member has at least two removal areas, located along a line and between positioning areas, the removal areas being less stiff than other areas of the heat dissipating member that correspond to areas of the substrate in which no light emitting elements are mounted.

10. The lighting apparatus of claim 9, wherein the groups of light emitting elements are positioned at substantially regular intervals in at least two directions on the substrate, and the removal area is in an area that corresponds to an area between the positioning areas of the groups.

11. The lighting apparatus of claim 10, wherein the groups of light emitting elements are positioned substantially in a matrix formation.

12. The lighting apparatus of claim 9, wherein the groups of light emitting elements are positioned at substantially regular intervals in two directions on the substrate, and the removal area is in an area that corresponds to an area inside a square whose vertexes are four of the positioning areas of the groups.

13. The lighting apparatus of claim 9, wherein the heat dissipating members have one or more openings within the removal area.

14. The lighting apparatus of claim 9, wherein each of the groups includes at least two LEDs that have mutually different luminous colors.

15. The lighting apparatus of claim 14, wherein each of the groups is made up of three LEDs with luminous colors of red, green, and blue respectively.

16. The lighting apparatus of claim 15, wherein the three LEDs in each of the groups are positioned at each of vertexes of a substantially regular triangle.

17. A flexible sheet supporting a plurality of light emitting elements comprising:

a flexible substrate having a wiring pattern;

a plurality of light emitting elements mounted on a first surface of a flexible substrate and connected to the wiring pattern in a repeating spatially spaced arrangement; and a plurality of heat dissipating support members integrally attached to a second surface of the flexible substrate in a correspondingly repeating spatially spaced arrangement to enable a relative movement of adjacent light emitting elements supported by adjacent heat dissipating support members; wherein the flexible sheet can conform to various supporting surfaces of a curvilinear configuration.

18. A lighting apparatus comprising:

a flexible substrate;

a plurality of sets of linearly arranged light emitting element groups, each group comprising an equal number of light emitting elements mounted on a first main surface of the flexible substrate;

one or more heat dissipating members coupled to and in intimate contact with a second main surface of the substrate, wherein the one or more heat dissipating members are shaped and positioned to facilitate the formation of linear concavities or convexities between the sets of light emitting element groups and to deter the formation of linear concavities that are collinear with the sets of lighting emitting element groups.

19. The lighting apparatus of claim 18 further comprising a plurality of bends forming regularly spaced linear concavities or convexities between sets of light emitting element groups.

20. The lighting apparatus of claim 19 further comprising a columnar pillar adhesively coupled to a surface of each of the one or more heat dissipating members opposite a surface in intimate contact with the second main surface of the flexible substrate.

21. A method of mounting an LED lighting apparatus to a curved surface comprising:

providing the apparatus of claim 18;

causing the apparatus to conform to the shape of a surface it is to be mounted to by forming a plurality of linear bends between the sets of light emitting element groups; and fastening the apparatus to the surface.

22. A lighting apparatus comprising:

a substrate that is flexible;

a plurality of light emitting elements that are mounted on a first main surface of the substrate so as to form groups each being made up of a predetermined number of light emitting elements, the predetermined number being one or larger;

at least two heat dissipating members attached so as to be in intimate contact with a second main surface of the substrate, wherein each of the at least two heat dissipating members is provided for either (a) a different one of the groups of light emitting elements or (b) a different one of units each being made up of groups of light emitting elements, the at least two heat dissipating members are positioned so as to cover and reinforce areas of the second main surface that correspond to positioning areas in which the light emitting elements are disposed;

the at least two heat dissipating members are positioned along predetermined lines so as to allow the substrate to form linear concavities or convexities along the predetermined lines; and the at least two heat dissipating members are substantially equal in size.

* * * * *